United States Patent
Hamada et al.

(10) Patent No.: US 8,981,351 B2
(45) Date of Patent: Mar. 17, 2015

(54) ORGANIC LIGHT-EMITTING DEVICE

(75) Inventors: Yuji Hamada, Yongin (KR); Kwan-Hee Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 908 days.

(21) Appl. No.: 13/087,268

(22) Filed: Apr. 14, 2011

(65) Prior Publication Data
US 2011/0260146 A1 Oct. 27, 2011

(30) Foreign Application Priority Data
Apr. 22, 2010 (KR) ........................ 10-2010-0037527

(51) Int. Cl.
*H01L 51/54* (2006.01)
*H01L 51/50* (2006.01)
*H01L 51/00* (2006.01)

(52) U.S. Cl.
CPC ........ *H01L 51/5012* (2013.01); *H01L 51/5048* (2013.01); *H01L 51/0055* (2013.01); *H01L 51/0059* (2013.01); *H01L 51/0067* (2013.01); *H01L 51/0081* (2013.01); *H01L 51/0085* (2013.01); *H01L 51/5052* (2013.01)
USPC .................................... 257/40; 257/E51.026

(58) Field of Classification Search
CPC ........................................................ H01L 51/54
USPC ............................................ 257/40, E51.026
See application file for complete search history.

(56) References Cited

U.S. PATENT DOCUMENTS

| | | | |
|---|---|---|---|
| 5,529,853 | A | 6/1996 | Hamada et al. |
| 2008/0111480 | A1 | 5/2008 | Lee et al. |
| 2008/0169755 | A1 | 7/2008 | Kim et al. |
| 2008/0185957 | A1 * | 8/2008 | Kato et al. ................... 313/503 |
| 2009/0284144 | A1 * | 11/2009 | Fujioka et al. ............... 313/504 |
| 2009/0295281 | A1 * | 12/2009 | Shin et al. .................... 313/504 |

FOREIGN PATENT DOCUMENTS

| | | |
|---|---|---|
| JP | 06-322362 | 11/1994 |
| JP | 2001-106678 A | 4/2001 |
| JP | 2002-093577 A | 3/2002 |
| JP | 2006-013464 A | 1/2006 |
| JP | 2006-066872 A | 3/2006 |
| JP | 2007-118218 A | 5/2007 |
| JP | 2008-159347 A | 7/2008 |
| JP | 2008-204850 A | 9/2008 |
| JP | 2009-289742 A | 12/2009 |
| KR | 1020070069158 A | 7/2007 |
| KR | 1020080043180 A | 5/2008 |
| WO | WO2008/016166 A1 | 2/2008 |

* cited by examiner

Primary Examiner — Marc Armand
(74) Attorney, Agent, or Firm — Knobbe Martens Olson & Bear LLP

(57) ABSTRACT

An organic light-emitting device including: a first electrode; a second electrode; and an organic layer that includes a carrier transport layer and an emission layer and is interposed between the first and second electrodes, wherein the emission layer and the carrier transport layer include the same material.

13 Claims, 1 Drawing Sheet

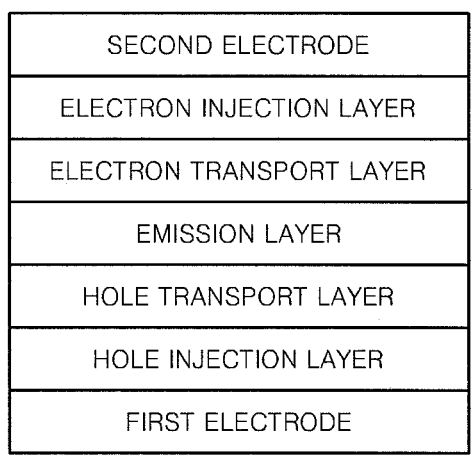

ORGANIC LIGHT-EMITTING DEVICE

CROSS-REFERENCE TO RELATED APPLICATIONS

This application claims the benefit of Korean Patent Application No. 10-2010-0037527, filed on Apr. 22, 2010, in the Korean Intellectual Property Office, the disclosure of which is incorporated herein in its entirety by reference.

BACKGROUND

1. Field

The present embodiments relate to an organic light-emitting device including a first electrode, a second electrode, and an organic film interposed between the first and second electrodes, the organic film including a carrier transport layer and an emission layer, the emission layer and the carrier transport layer including the same material.

2. Description of the Related Technology

Organic light-emitting devices (OLEDs) have been actively researched for use in displays and lamps. OLEDs are injection type light-emitting devices that emit light as electrons injected from a negative electrode and holes injected from a positive electrode recombine in an emission layer. OLEDs have a structure allowing the injected electrons and holes to easily combine. For example, a conventional OLED includes a positive electrode, a hole injection layer, a hole transport layer, an emission layer, an electron transport layer, an electron injection layer, and a negative electrode, which are stacked in the stated order, and each layer has a different function.

SUMMARY

The present embodiments provide an organic light-emitting device having improved emission efficiency and a low driving voltage.

According to an aspect of the present embodiments, there is provided an organic light-emitting device including: a first electrode; a second electrode; and an organic layer interposed between the first electrode and the second electrode, the organic layer including a carrier transport layer and an emission layer, wherein a material having the highest proportion in the emission layer and a material having the highest proportion in the carrier transport layer that is adjacent to the emission layer and has an interface with the emission layer may be the same.

The material may be a metal complex.

The material may be a metal complex, and a central metal atom may be beryllium (Be), aluminum (Al), or zinc (Zn).

The material may be bis(10-benzoquinolate) beryllium.

The material may be bis(2-methyl-8-quinolinolato)(p-phenylphenolato) aluminum(III) (BAlq).

The material may be bis(2-(2-hydroxyphenyl)benzothiazolate)zinc (ZnBTZ).

The material may be bis(2-(2-hydroxyphenyl)benzoxazolate)zinc (ZnPBO).

The organic light-emitting device may have a structure including first electrode/hole injection layer/emission layer/second electrode; a structure including first electrode/hole injection layer/hole transport layer/emission layer/electron transport layer/second electrode; a structure including first electrode/hole injection layer/hole transport layer/emission layer/electron transport layer/electron injection layer/second electrode layer; a structure including first electrode/hole injection layer/charge-generating layer/hole transport layer/emission layer/electron transport layer/second electrode; or a structure including first electrode/hole injection layer/charge-generating layer/hole transport layer/emission layer/electron transport layer/electron injection layer/second electrode.

BRIEF DESCRIPTION OF THE DRAWING

The above and other features and advantages of the present embodiments will become more apparent by describing in detail exemplary embodiments thereof with reference to the attached drawing in which:

FIG. 1 illustrates a structure of an organic light-emitting device according to an embodiment.

DETAILED DESCRIPTION OF CERTAIN INVENTIVE EMBODIMENTS

The present embodiments will now be described more fully with reference to the accompanying drawings, in which exemplary embodiments are shown.

An organic light-emitting device (OLED) according to one embodiment includes a first electrode; a second electrode; and an organic layer interposed between the first and second electrodes and including a carrier transport layer and an emission layer (EML), wherein a material having the highest proportion in the EML and a material having the highest proportion in the carrier transport layer that is adjacent to the EML and has an interface with the EML are the same.

In some embodiments of an OLED, organic materials are stacked on each other in such a way that an arrangement of the organic materials is optimized, thereby improving emission efficiency and reducing driving voltage. Thus, the OLED is used to realize a panel having excellent characteristics.

Some embodiments relate to organic materials which can optimize the structure of the OLED.

The OLED includes a hole injection layer (HIL), a hole transport layer (HTL), an EML, an electron transport layer (ETL), and an electron injection layer (EIL). The OLED may include the EML and the carrier transport layer including the HIL, the HTL, the ETL, and the EIL. Each layer has a distinct function as the majority of carriers in the organic layer are different near a negative electrode and near a positive electrode. More electrons exist near the negative electrode and more holes exist near the positive electrode. Accordingly, the HIL and HTL, which are placed near the positive electrode, are formed of a material having high hole mobility, and the EIL and ETL, which are placed near the negative electrode, are formed of a material having high electron mobility. In addition, the EML interposed between the positive electrode and the negative electrode is formed of a bipolar material.

The required performance of a carrier is different in the organic layer based on whether the carrier is placed near the negative electrode or near the positive electrode. Also, the OLED cannot be formed by using a single material. Accordingly, different materials are used according to the performance of each layer, and the OLED is designed so that each layer is disposed at an optimum location.

However, since the layers are respectively formed of different materials having different properties, a plurality of interfaces exist therebetween. The materials having different properties have different energy levels, such as a highest occupied molecular orbital (HOMO) level and a lowest unoccupied molecular orbital (LUMO) level. Thus, values of the HOMO level and LUMO level differ in adjacent layers, thereby impeding injection of carriers to a following layer.

Such a fact increases the driving voltage and reduces the lifespan of the OLED by reducing emission efficiency thereof.

In the OLED according to the current embodiment, adjacent layers are formed of the same material. Thus, a carrier movement between each layer is not blocked, and thus, the OLED has excellent characteristics.

According to an embodiment, the material may be a metal complex.

According to another embodiment, the material may be a metal complex and a central metal may be beryllium (Be), aluminum (Al), or zinc (Zn).

According to an embodiment, the material may be bis(10-benzoquinolate)beryllium (BeBq$_2$), bis(2-methyl-8-quinolinolato)(p-phenylphenolato)aluminum(III) (BAlq), ZnBTZ, or ZnPBO, except when the material is Alq$_3$.

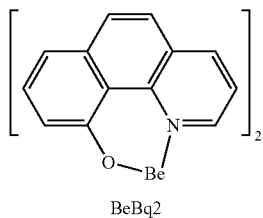

BeBq2

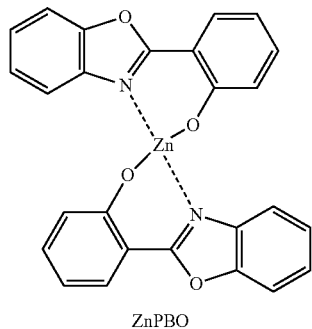

ZnPBO

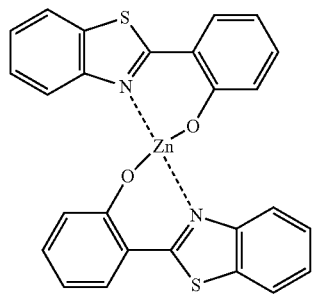

ZnBTZ

Here, the first electrode may be the negative electrode, and the second electrode may be the positive electrode.

In the OLED described above, the organic layer may further include at least one layer selected from the group consisting of the HIL, the HTL, an electron blocking layer, the EML, a hole blocking layer (HBL), the ETL, and the EIL, if required.

For example, the OLED according to the current embodiment may have a structure including first electrode/HIL/ EML/second electrode, a structure including first electrode/ HIL/HTL/EML/ETL/second electrode, a structure including first electrode/HIL/HTL/EML/ETL/EIL/second electrode, a structure including first electrode/HIL/charge-generating layer/HTL/EML/ETL/second electrode, or a structure including first electrode/HIL/charge-generating layer/HTL/ EML/ETL/EIL/second electrode. Alternatively, the OLED may have a structure including first electrode/single layer having both hole injection and hole transport capabilities/ EML/ETL/second electrode, or a structure including first electrode/single layer having both hole injection and hole transport capabilities/EML/ETL/EIL/second electrode.

The OLED according to the current embodiment may be a top-emission OLED or a bottom-emission OLED.

The organic layer of the organic light-emitting device may include a hole injection layer, a hole transport layer, a functional layer having hole injecting and transporting capabilities, an emission layer, a hole blocking layer, an electron transport layer, an electron injecting layer, or a combination of two or more layers thereof. However, the organic layer is not limited thereto. At least one layer selected from the hole injection layer, the hole transport layer, or the functional layer having hole injecting and transporting capabilities may further include a charge-generating material, in addition to a heterocyclic compound according to an embodiment of the present invention, a known hole injecting material, and a known hole transporting material, so as to improve film conductivity.

The charge-generating material may be, for example, p-dopant. Nonlimiting examples of the p-dopant are quinine derivatives, such as tetracyanoquinodimethane (TCNQ) or 2,3,5,6-tetrafluoro-tetracyano-1,4-benzoquinonedimethane (F4TCNQ); metal oxides, such as tungsten oxide and molybdenum oxide; and a cyano group-containing compound such as Compound 100 below:

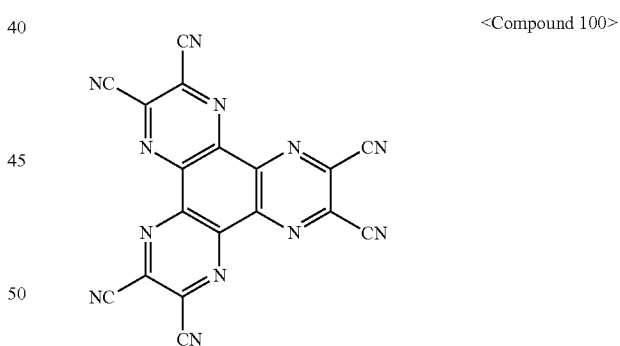

<Compound 100>

If the hole injection layer, the hole transport layer, or the functional layer having hole injecting and transporting capabilities further include the charge-generating material, the charge-generating material may be uniformly or non-uniformly dispersed in the corresponding layer.

The electron transport layer of the organic light-emitting device according to an embodiment of the present invention may further include an electron transporting organic compound and a metal-containing material. Nonlimiting examples of the electron transporting organic compound are 9,10-di(naphtalene-2-yl)anthracene (ADN); and an anthracene-based compound, such as Compounds 101 and 102 below.

<Compound 101>

<Compound 102>

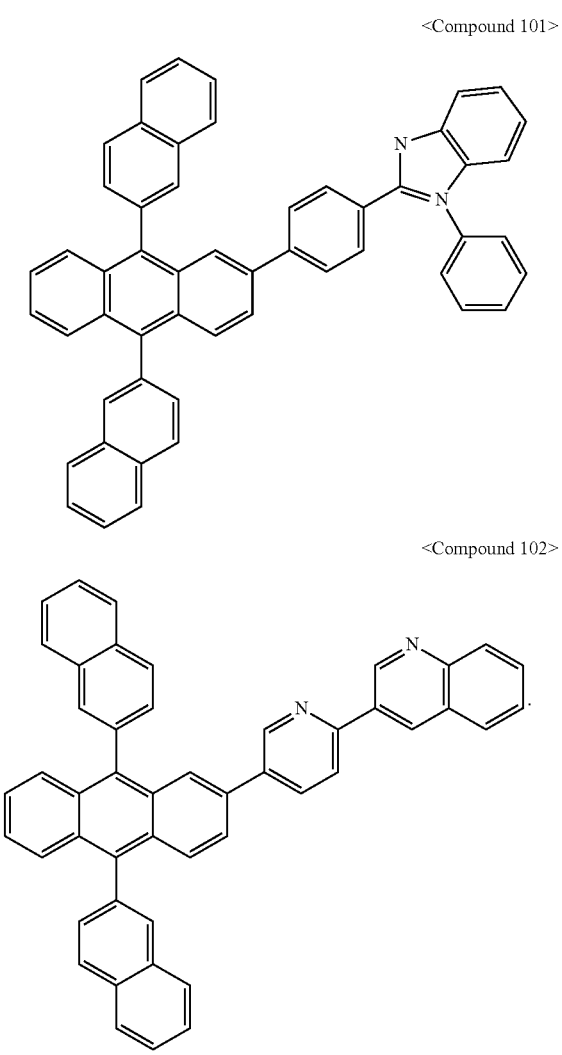

The metal-containing material may include a Li complex. Nonlimiting examples of the Li complex are lithium quinolate (LiQ) and Compound 103 below:

<Compound 103>

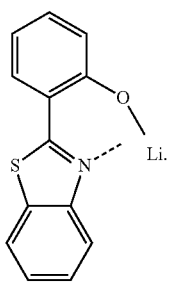

Hereinafter, a method of manufacturing an OLED according to an embodiment will be described with reference to FIG. 1. FIG. 1 illustrates the structure of an OLED according to an embodiment. Referring to FIG. 1, the OLED includes a substrate, a first electrode (negative electrode), a HIL, a HTL, an EML, an ETL, an EIL, and a second electrode (positive electrode).

First, the first electrode is formed on the substrate by using a deposition or sputtering method. The first electrode may be formed of a first electrode material having a high work function. The first electrode may be a negative electrode. The substrate may be a substrate conventionally used in OLEDs, and may include, for example, a glass substrate or a transparent plastic substrate with excellent mechanical strength, thermal stability, transparency, surface smoothness, ease of handling, and water resistance. Examples of the first electrode material include, for example, indium tin oxide (ITO), indium zinc oxide (IZO), tin oxide (SnO2), zinc oxide (ZnO), aluminum (Al), silver (Ag), and magnesium (Mg), or other materials which have excellent conductivity. The first electrode may be formed as a transparent or reflective electrode.

The HIL may be formed on the first electrode using various methods, for example, by vacuum deposition, spin coating, casting, Langmuir-Blodgett (LB) deposition, or the like.

When the HIL is formed using vacuum deposition, the deposition conditions may vary according to a compound that is used to form the HIL, and the structure and thermal characteristics of the HIL to be formed. For example, the deposition conditions may include a deposition temperature of from about 100 to about 500° C., a vacuum pressure of from about $10^{-8}$ to $10^{-3}$ ton, and a deposition rate of from about 0.01 to about 100 Å/sec.

When the HIL is formed using spin coating, the coating conditions may vary according to a material that is used to form the HIL, and the structure and thermal properties of the HIL to be formed. For example, the coating conditions may include a coating speed of about 2000 rpm to about 5000 rpm, and a thermal treatment temperature of about 80° C. to about 200° C., wherein the thermal treatment is for removing a solvent after coating.

The HIL may be formed of any material that is commonly used to form a HIL. Examples of the material that can be used to form the HIL include a phthalocyanine compound such as copperphthalocyanine, 4,4',4''-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS), but are not limited thereto.

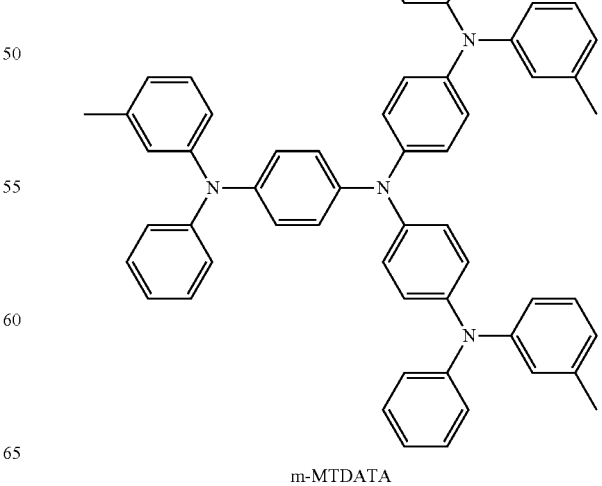

m-MTDATA

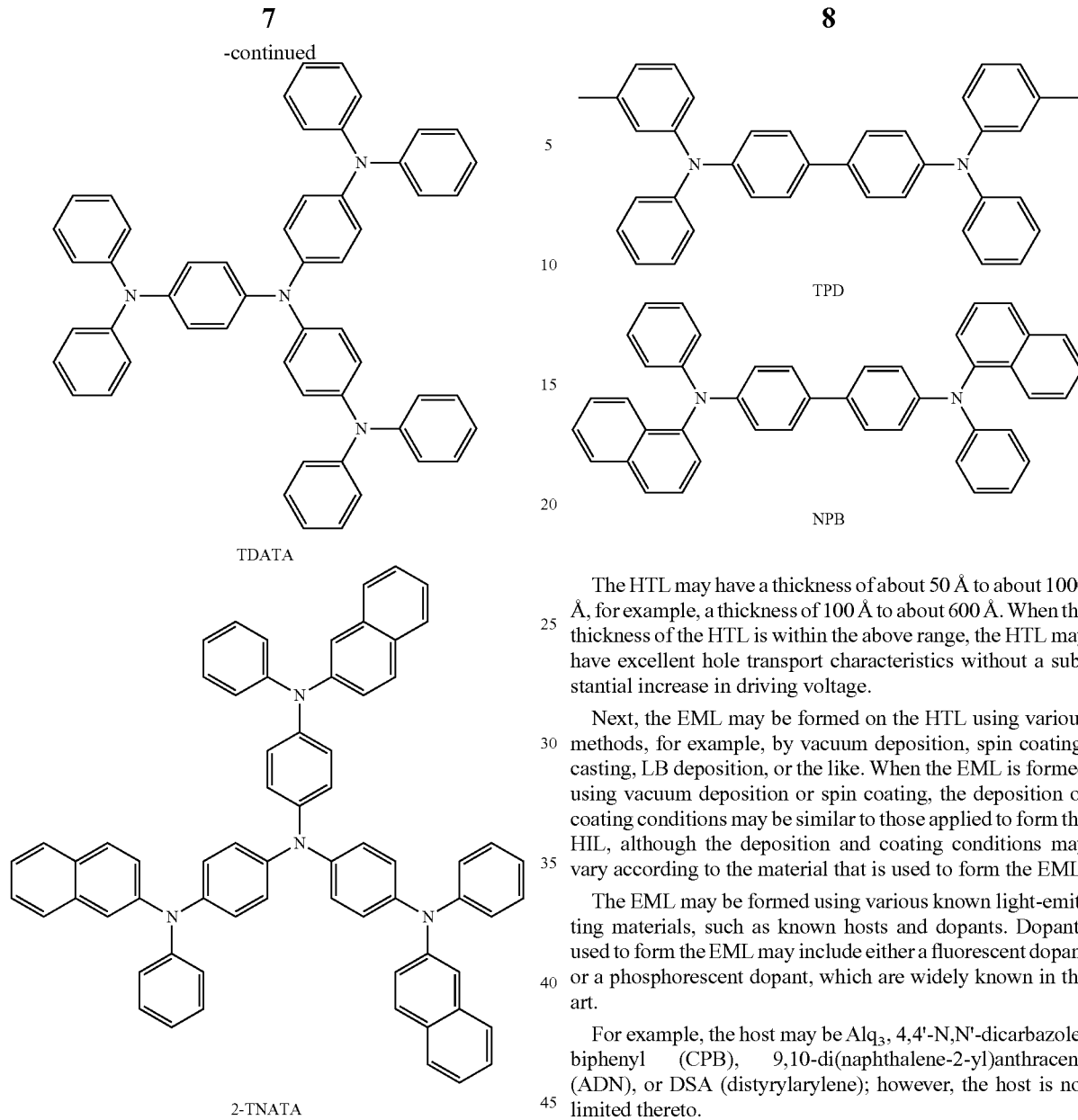

TDATA

2-TNATA

TPD

NPB

The HIL may have a thickness of about 100 Å to about 10000 Å, for example, a thickness of about 100 Å to about 1000 Å. When the thickness of the HIL is within the above range, the HIL may have excellent hole injection characteristics without an increase in a driving voltage.

Next, the HTL may be formed on the HIL using various methods, for example by vacuum deposition, spin coating, casting, LB deposition, or the like. When the HTL is formed using vacuum deposition or spin coating, the deposition or coating conditions may be similar to those applied to form the HIL, though the deposition or coating conditions may vary according to the material that is used to form the HTL.

Alternatively, well-known HTL materials may be used. Examples of such HTL materials include, but are not limited to, cabazol derivatives such as N-phenylcarbazol or polyvinylcarbazol, and amine derivatives having an aromatic condensed ring, such as NPB, or N,N'-bis(3-methylphenyl)-N,N'-diphenyl-[1,1-biphenyl]-4,4'-diamine (TPD). For example, TCTA may not only transport holes but also inhibit excitons from being diffused from the EML.

The HTL may have a thickness of about 50 Å to about 1000 Å, for example, a thickness of 100 Å to about 600 Å. When the thickness of the HTL is within the above range, the HTL may have excellent hole transport characteristics without a substantial increase in driving voltage.

Next, the EML may be formed on the HTL using various methods, for example, by vacuum deposition, spin coating, casting, LB deposition, or the like. When the EML is formed using vacuum deposition or spin coating, the deposition or coating conditions may be similar to those applied to form the HIL, although the deposition and coating conditions may vary according to the material that is used to form the EML.

The EML may be formed using various known light-emitting materials, such as known hosts and dopants. Dopants used to form the EML may include either a fluorescent dopant or a phosphorescent dopant, which are widely known in the art.

For example, the host may be $Alq_3$, 4,4'-N,N'-dicarbazole-biphenyl (CPB), 9,10-di(naphthalene-2-yl)anthracene (ADN), or DSA (distyrylarylene); however, the host is not limited thereto.

Examples of well-known red dopants include, but are not limited to, platinum(II) octaethylporphyrin (PtOEP), $Ir(piq)_3$, $Btp_2Ir(acac)$, and DCJTB.

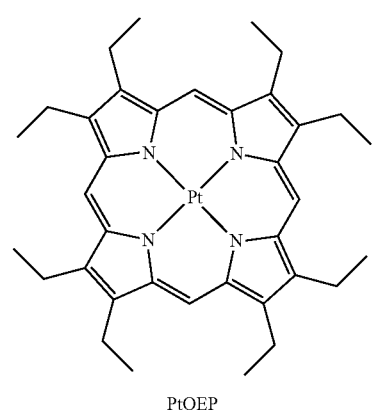

PtOEP

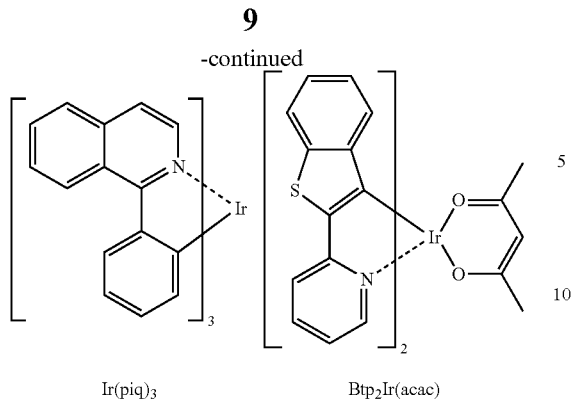
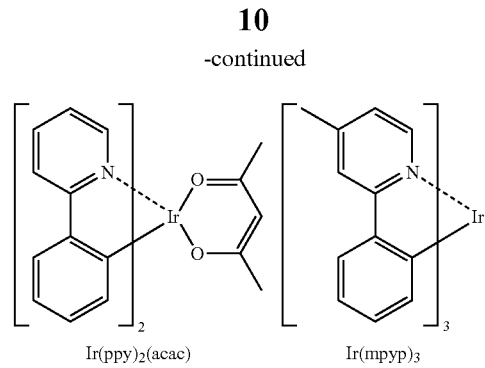

Ir(piq)₃   Btp₂Ir(acac)   Ir(ppy)₂(acac)   Ir(mpyp)₃

Examples of well-known green dopants may include, but are not limited to, Ir(ppy)₃ (where "ppy" denotes phenylpyridine), Ir(ppy)₂(acac), Ir(mpyp)₃, and C545T.

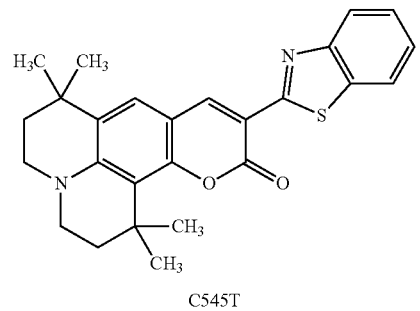

C545T

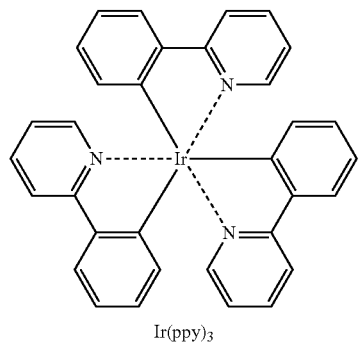

Ir(ppy)₃

Examples of well-known blue dopants include, but are not limited to, F₂Irpic, (F₂ppy)₂Ir(tmd), Ir(dfppz)₃, ter-fluorene, 4,4'-bis(4-diphenylaminostyryl)biphenyl (DPAVBi), and 2,5,8,11-tetra-t-butyl pherylene (TBP).

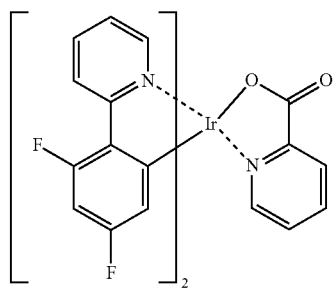

F₂Irpic

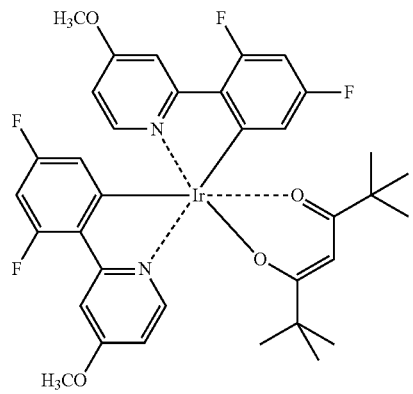

Ir(ppy)₃

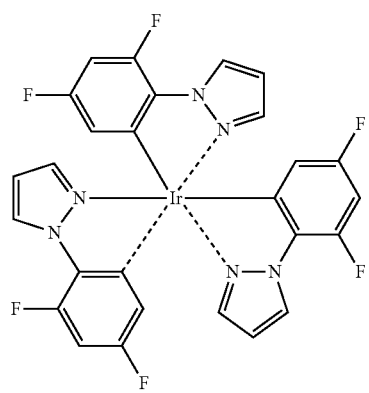

Ir(dfppz)₃

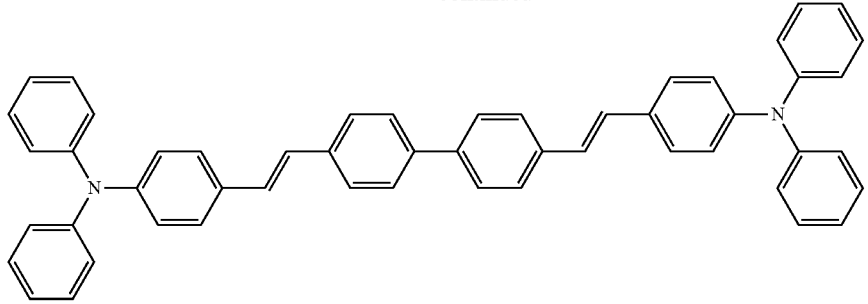

DPAVBi

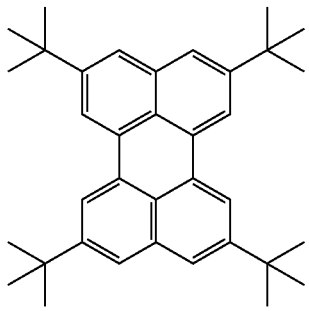

TBP

The amount of the dopant may be from about 0.1 to about 20 parts by weight, or about 0.5 to about 12 parts by weight, based on 100 parts by weight of the EML material, which is equivalent to the total weight of the host and the dopant. When the amount of the dopant is within the above ranges, concentration quenching may be substantially prevented.

The EML may have a thickness of about 100 Å to about 1,000 Å, for example, about 200 Å to about 600 Å. When the thickness of the EML is within the above range, the EML may have excellent light-emitting characteristics without a substantial increase in the driving voltage.

When the EML includes a phosphorescent dopant, an HBL (not shown in FIG. 1) may be formed on the EML in order to prevent diffusion of triplet excitons or holes into the ETL. In this case, the HBL may be formed of any material that is commonly used to form a HBL. Examples of such HBL materials include, but are not limited to, oxadiazole derivatives, triazole derivatives, phenathroline derivatives, Balq, and BCP.

The HBL may have a thickness of about 50 Å to about 1,000 Å, for example, about 100 Å to about 300 Å. When the thickness of the HBL is within the above range, the HBL may have excellent hole blocking characteristics without a substantial increase in the driving voltage.

Next, the ETL is formed on the EML (or HBL) using various methods, for example, by vacuum deposition, spin coating, casting, or the like. When the ETL is formed using vacuum deposition or spin coating, the deposition or coating conditions may be similar to those applied to form the HIL, though the deposition and coating conditions may vary according to the material that is used to form the ETL.

The ETL may be formed of any known materials used to form an ETL. Examples of the ETL material include, but are not limited to, quinoline derivatives, such as tris(8-quinolinolate)aluminum $Alq_3$, TAZ, and Balq.

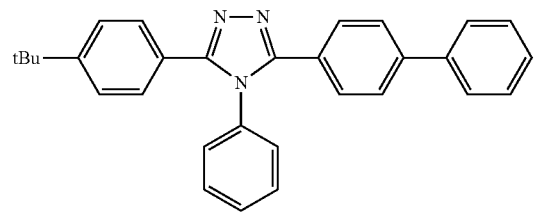

TAZ

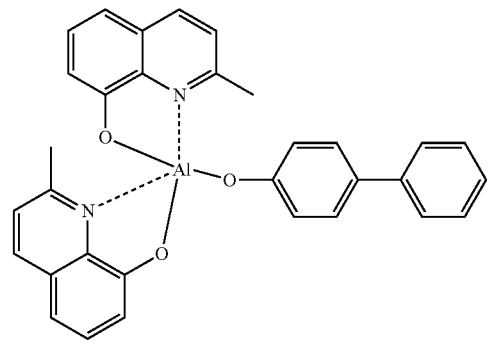

BAlq

The ETL may have a thickness of about 100 Å to about 1,000 Å, for example, about 100 Å to about 500 Å. When the ETL has a thickness within the above range, the ETL may have excellent electron transport characteristics without a substantial increase in a driving voltage.

In addition, the EIL, which facilitates injection of electrons from the negative electrode, may be formed on the ETL.

The EIL may be formed of LiF, NaCl, CsF, $Li_2O$, BaO, or the like. The deposition or coating conditions for forming the EIL may be similar to those applied to form the HIL, though the deposition and coating conditions may vary according to that used to form the EIL.

The EIL may have a thickness of about 1 Å to about 100 Å, for example, about 5 Å to about 90 Å. When the thickness of the EIL is within the above range, the EIL may have excellent electron injection characteristics without a substantial increase in driving voltage.

Finally, the second electrode may be formed on the EIL using, for example, vacuum deposition, sputtering, or the like. The second electrode may be a positive electrode or a negative electrode. A second electrode material may include a metal, an alloy, an electrically conductive compound, or mixtures thereof, all of which have a low work function. Examples of such materials may include, but are not limited to, lithium (Li), magnesium (Mg), aluminum (Al), aluminum-lithium (Al—Li), calcium (Ca), magnesium-indium (Mg—In), and magnesium-silver (Mg—Ag). In addition, in order to manufacture a top-emission OLED, a transparent positive electrode formed of a transparent material such as ITO or IZO may be used as the second electrode.

According to the method, materials that have the highest proportion in the EML and a carrier transport layer, such as the ELT or HTL which is adjacent to the EML, are the same.

Hereinafter, one or more embodiments will be described in detail with reference to the following examples. These examples are not intended to limit the purpose and scope of the one or more embodiments.

EXAMPLE 1

ITO/NPB(700 Å)/HAT-CN 6 (50 Å)/NPB(1550 Å)/BeBq$_2$+2% Ir(piq)$_3$(400 Å)/BeBq$_2$(300 Å)/Liq(5 Å)/MgAg(150 Å)

A negative electrode was prepared by cutting a Corning 15 Ωcm$^2$ (1200 Å) ITO glass substrate to a size of 50 mm×50 mm×0.7 mm, ultrasonically cleaning the glass substrate using isopropyl alcohol and pure water for 5 minutes each, and then irradiating UV light for 30 minutes and exposing to ozone to clean. Then, the negative electrode was loaded into a vacuum deposition apparatus.

Then, first, 4,4'-bis[N-(1-naphthyl)-N-phenylamino]biphenyl (NPB), which is a known HIL material, was vacuum-deposited on the glass substrate to form a HIL having a thickness of 700 Å. Then, HAT-CA6, which is a known charge-generating compound, was vacuum-deposited to form a charge-generating layer having a thickness of 50 Å, and then NPB was vacuum-deposited to form a HTL having a thickness of 1550 Å.

The EML having a thickness of 400 Å was formed on the HTL by simultaneously depositing BeBq$_2$ and Ir(piq)$_3$ in a weight ratio of 98:2.

Then, BeBq$_2$ was deposited on the EML to form an ETL having a thickness of 300 Å, and then Liq, which is a halogenated alkali metal, was deposited on the ETL to form an EIL having a thickness of 5 Å. Then, MgAg was vacuum-deposited on the EIL to form a negative electrode having a thickness of 150 Å, thereby forming an Liq/MgAg electrode. As a result, an organic light-emitting device was completely manufactured.

The OLED had a driving voltage of 4.2 V at a current density of 4.9 mA/cm$^2$, a color coordinate of (0.667, 0.339), and a luminescent efficiency of 29.6 cd/A.

EXAMPLE 2

ITO/NPB(700 Å)/HAT-CN 6 (50 Å)/NPB(1550 Å)/BAlq+35% Ir(piq)$_3$(200 Å)/BAlq(300 Å)/Liq(5 Å)/MgAg(150 Å)

An OLED was prepared in the same manner as in Example 1, except that BAlq and Ir(piq)$_3$ were used in a weight ratio of 65:35 instead of BeBq$_2$ and Ir(piq)$_3$ while forming an EML, and BAlq was deposited as an ETL instead of BeBq$_2$.

The OLED had a driving voltage of 4.8 V at a current density of 5.2 mA/cm$^2$, a color coordinate of (0.665, 0.334), and a luminescent efficiency of 25.5 cd/A.

EXAMPLE 3

ITO/NPB(750 Å)NPB(1100 Å)/ZnBTZ+Coumarin C-545 5%(200 Å)/ZnBTZ+Liq 40%(300 Å)/Liq(5 Å)/MgAg(150 Å)

An OLED was prepared in the same manner as in Example 1, except that ZnBTZ and Coumarin C-545 were simultaneously deposited in a weight ratio of 95:5 while forming an EML instead of BeBq$_2$ and Ir(piq)$_3$, ZnBTZ and Liq were simultaneously deposited in a weight ratio of 60:40 as an ETL instead of BeBg$_2$, NPB was formed to have a thickness of 750 Å as a HIL, NPB was formed to have a thickness of 1100 Å as a HTL, and HAT-CN6 was not deposited.

The OLED had a driving voltage of 4.5 V at a current density of 5.0 mA/cm$^2$, a color coordinate of (0.314, 0.662) for fluorescent green, and a luminescent efficiency of 25.1 cd/A.

EXAMPLE 4

ITO/NPB(700 Å)/HAT-CN 6 (50 Å)/NPB(850 Å)/ZnPBO+Peryrene TBP 3%(200 Å)/ZnPBO(300 Å)/Liq(5 Å)/MgAg(150 Å)

An OLED was prepared in the same manner as in Example 1, except that ZnPBO and Peryrene TBP were simultaneously deposited in a weight ratio of 97:3 while forming an EML instead of BeBq$_2$ and Ir(piq)$_3$, and ZnPBO was deposited on an ETL instead of BeBq$_2$.

The OLED had a driving voltage of 4.9 V at a current density of 16.6 mA/cm$^2$, a color coordinate of (0.14, 0.06), and a luminescent efficiency of 2.9 cd/A.

COMPARATIVE EXAMPLE

ITO/NPB(700 Å)/HAT-CN 6 (50 Å)/NPB(1550 Å)/BeBq$_2$+2%Ir(piq)$_3$(400 Å)/TAZ(300 Å)/Liq(5 Å)/MgAg(150 Å)

A negative electrode was prepared by cutting a Corning 15 Ωcm$^2$ (1200 Å) ITO glass substrate to a size of 50 mm×50 mm×0.7 mm, ultrasonically cleaning the glass substrate using isopropyl alcohol and pure water for 5 minutes each, and then irradiating UV light for 30 minutes and exposing to ozone to clean. Then, the negative electrode was loaded into a vacuum deposition apparatus.

Then, first, 4,4'-bis[N-(1-naphthyl)-N-phenylamino]biphenyl (NPB), which is a known HIL material, was vacuum-deposited on the glass substrate to form a HIL having a thickness of 700 Å. Then, HAT-CA6, which is a known charge-generating compound, was vacuum-deposited to form a charge-generating layer having a thickness of 50 Å, and then NPB was vacuum-deposited to form a HTL having a thickness of 1550 Å.

Then, TAZ was deposited on the EML to form an ETL having a thickness of 300 Å, and then Liq, which is a halogenated alkali metal, was deposited on the ETL to form an EIL having a thickness of 5 Å. Then, MgAg was vacuum-deposited on the EIL to form a negative electrode having a thickness of 150 Å, thereby completing the manufacture of an OLED.

The OLED had a driving voltage of 7.2 V at a current density of 6.7 mA/cm², a color coordinate of (0.666, 0.338), and a luminescent efficiency of 19.2 cd/A.

The driving voltages, color coordinates, and luminescent efficiencies of the OLEDs of Examples 1 and 4 and Comparative Example are shown in Table 1.

TABLE 1

|  | Driving Voltage (V) | Current Density (mA/cm²) | Luminescent Efficiency (cd/A) | Color Coordinates |
|---|---|---|---|---|
| Example 1 | 4.2 | 4.9 | 29.6 | (0.667, 0.331) |
| Example 2 | 4.8 | 5.2 | 25.5 | (0.665, 0.334) |
| Example 3 | 4.5 | 5.0 | 25.1 | (0.314, 0.662) |
| Example 4 | 4.9 | 16.6 | 2.9 | (0.14, 0.06) |
| Comparative Example | 7.2 | 6.7 | 19.2 | (0.666, 0.338) |

Referring to Table 1, the organic light-emitting devices of Examples 1 through 4 had better characteristics, as compared to the organic light-emitting device of Comparative Example.

An organic light-emitting device according to one or more embodiments has good characteristics since an energy barrier to an interface can be reduced by using the same material for an electron transport layer and a host of an emission layer.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic light-emitting device comprising:
a first electrode;
a second electrode; and
an organic layer interposed between the first electrode and the second electrode, the organic layer comprising an electron transport layer and an emission layer different in composition from and adjacent to the electron transport layer,
wherein the material with the highest weight proportion in the emission layer and the material with the highest weight proportion in the electron transport layer are the same material,
wherein the material is bis(10-benzoquinolate) beryllium, bis(2-methyl-8-quinolinoato)(p-phenylphenolato)aluminum(III) (BAlq), bis(2-(2-hydroxyphenyl)benzothiazolate)zinc (ZnBTZ), or bis(2-(2-hydroxypenyl)benzoxazolate)zinc(ZnPBO).

2. The organic light-emitting device of claim 1, wherein the material is a metal complex.

3. The organic light-emitting device of claim 1, wherein the material is a metal complex with a central metal atom of beryllium (Be), aluminum (Al), or zinc (Zn).

4. The organic light-emitting device of claim 1, wherein the material is a metal complex with a central metal atom of beryllium (Be).

5. The organic light-emitting device of claim 1, wherein the material is a metal complex with a central metal atom of aluminum (Al).

6. The organic light-emitting device of claim 1, wherein the material is a metal complex with a central metal atom of zinc (Zn).

7. The organic light-emitting device of claim 1, comprising one selected from the group consisting of:
a structure comprising: first electrode/hole injection layer/hole transport layer/emission layer/electron transport layer/second electrode; a structure comprising: first electrode/hole injection layer/hole transport layer/emission layer/electron transport layer/electron injection layer/second electrode layer; a structure comprising: first electrode/hole injection layer/charge-generating layer/hole transport layer/emission layer/electron transport layer/second electrode; and a structure comprising: first electrode/hole injection layer/charge-generating layer/hole transport layer/emission layer/electron transport layer/electron injection layer/second electrode.

8. The organic light-emitting device of claim 1, wherein the organic layer further comprises a hole injection layer, a hole transport layer, a functional layer having hole injecting and transporting capabilities, an emission layer, a hole blocking layer, an electron transport layer, an electron injecting layer, or a combination of two or more layers thereof.

9. A display device comprising the organic light-emitting device of claim 1.

10. A display device comprising the organic light-emitting device of claim 3.

11. The organic light-emitting device of claim 8, at least one layer selected from the hole injection layer, the hole transport layer, or the functional layer having hole injecting and transporting capabilities further comprises a charge-generating material.

12. The organic light-emitting device of claim 8, wherein the electron transport layer of the organic light-emitting device comprises an electron transporting organic material and a metal-containing material.

13. The organic light-emitting device of claim 12, wherein the metal-containing material comprises a Li complex.

* * * * *